(12) United States Patent
Omura

(10) Patent No.: US 12,301,203 B2
(45) Date of Patent: May 13, 2025

(54) ACOUSTIC WAVE DEVICE

(71) Applicant: Murata Manufacturing Co., Ltd., Nagaokakyo (JP)

(72) Inventor: Masashi Omura, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 245 days.

(21) Appl. No.: 18/301,999

(22) Filed: Apr. 18, 2023

(65) Prior Publication Data
US 2023/0261631 A1  Aug. 17, 2023

Related U.S. Application Data

(63) Continuation of application No. PCT/JP2021/038079, filed on Oct. 14, 2021.

(30) Foreign Application Priority Data

Oct. 23, 2020 (JP) ................. 2020-177697

(51) Int. Cl.
*H03H 9/02* (2006.01)
*H03H 9/17* (2006.01)
*H03H 9/56* (2006.01)

(52) U.S. Cl.
CPC .... *H03H 9/02133* (2013.01); *H03H 9/02031* (2013.01); *H03H 9/02102* (2013.01);
(Continued)

(58) Field of Classification Search
CPC ........... H03H 9/02133; H03H 9/02031; H03H 9/02102; H03H 9/173; H03H 9/175;
(Continued)

(56) References Cited

U.S. PATENT DOCUMENTS

2017/0288122 A1* 10/2017 Zou ................. H03H 9/175

FOREIGN PATENT DOCUMENTS

JP  2005-176332 A   6/2005
JP  2005-318562 A   11/2005
(Continued)

OTHER PUBLICATIONS

International Search Report and Written Opinion mailed on Dec. 21, 2021, received for PCT Application PCT/JP2021/038079, filed on Oct. 14, 2021, 9 pages including English Translation.

*Primary Examiner* — Jorge L Salazar, Jr.
(74) *Attorney, Agent, or Firm* — XSENSUS LLP

(57) ABSTRACT

An acoustic wave device includes a support substrate, and a piezoelectric layer provided on the support substrate. The piezoelectric layer has a first main surface opposite to a second main surface. The piezoelectric layer also includes a first direction orthogonal to a second direction. A first electrode is provided on the piezoelectric layer's first main surface, and a second electrode is provided on the piezoelectric layer's second main surface to face the first electrode. An energy confining portion is provided between the support substrate and the piezoelectric layer. The piezoelectric layer is anisotropic with respect to a coefficient of linear expansion, and in the piezoelectric layer, a coefficient of linear expansion in the first direction is different from a coefficient of linear expansion in the second direction. At least one of the piezoelectric layer, the first electrode, and the second electrode is parallel to the first direction.

20 Claims, 10 Drawing Sheets

(52) U.S. Cl.
CPC ............ *H03H 9/173* (2013.01); *H03H 9/175* (2013.01); *H03H 9/176* (2013.01); *H03H 9/562* (2013.01); *H03H 9/564* (2013.01); *H03H 9/568* (2013.01)

(58) Field of Classification Search
CPC ........ H03H 9/176; H03H 9/562; H03H 9/564; H03H 9/568; H03H 9/02015
USPC .................................................. 333/186–188
See application file for complete search history.

(56) References Cited

FOREIGN PATENT DOCUMENTS

| | | |
|---|---|---|
| JP | 2005-347898 A | 12/2005 |
| WO | 2018/216632 A1 | 11/2018 |
| WO | 2020/209152 A1 | 10/2020 |

\* cited by examiner

ACOUSTIC WAVE DEVICE

CROSS-REFERENCE TO RELATED APPLICATIONS

This application is a continuation of International Application No. PCT/JP2021/038079, filed Oct. 14, 2021, which claims the benefit of priority to JP 2020-177697, filed Oct. 23, 2020. The contents of these prior applications are hereby incorporated by reference in their entirety.

TECHNICAL FIELD

The present disclosure relates to an acoustic wave device.

BACKGROUND ART

An acoustic wave device has been widely used for a filter of a mobile phone and the like. Patent Document 1 below discloses an example of an acoustic wave device. In the acoustic wave device, a piezoelectric film is provided on a substrate. An upper electrode is provided on one main surface of the piezoelectric film, and a lower electrode is provided on the other main surface. A gap is provided between the lower electrode and the substrate.

CITATION LIST

Patent Document

Patent Document 1: Japanese Unexamined Patent Application Publication No. 2005-347898

SUMMARY

Technical Problem

For example, in a piezoelectric single crystal such as $LiNbO_3$ or $LiTaO_3$, a coefficient of linear expansion differs in a plane. In other words, for example, a piezoelectric body such as $LiNbO_3$ or $LiTaO_3$ has anisotropy in the coefficient of linear expansion. In a case that the piezoelectric body above is used for a piezoelectric film in Patent Document 1, when temperature changes, warpage may occur in the piezoelectric film due to a difference in the coefficient of linear expansion.

An aspect of the present disclosure is to provide an acoustic wave device capable of suppressing the warpage of a piezoelectric layer even when the piezoelectric layer has anisotropy in the coefficient of linear expansion.

Solution to Problem

An acoustic wave device according to an exemplary aspect of the present disclosure includes a support substrate, and a piezoelectric layer provided on the support substrate. The piezoelectric layer has a first main surface opposite a second main, and a first direction orthogonal to a second direction. A first electrode is provided on the first main surface of the piezoelectric layer, and a second electrode is provided on the second main surface of the piezoelectric layer to face the first electrode. An energy confining portion is provided between the support substrate and the piezoelectric layer. The piezoelectric layer has anisotropy in a coefficient of linear expansion, and in the piezoelectric layer, a coefficient of linear expansion in the first direction is different from a coefficient of linear expansion in the second direction. At least one of the piezoelectric layer, the first electrode, and the second electrode is parallel with the first direction.

Advantageous Effects

According to the acoustic wave device of the present disclosure, warpage of a piezoelectric layer may be suppressed even when the piezoelectric layer has anisotropy in a coefficient of linear expansion.

DESCRIPTION OF EXEMPLARY EMBODIMENTS

Hereinafter, exemplary embodiments of the present disclosure will be described with reference to the drawings to clarify the present disclosure.

It should be noted that the embodiments described in the present description are merely examples, and partial replacement or combination of configurations is possible between different embodiments.

Figure 1:
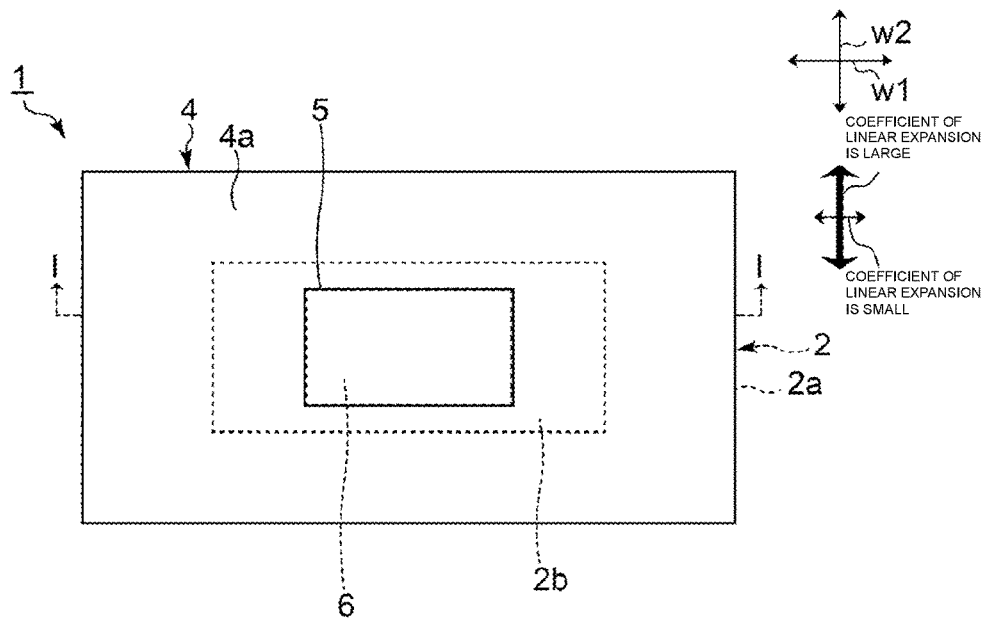
FIG. 1 is a plan view of an acoustic wave device according to a first exemplary embodiment of the present disclosure.
Figure 2:
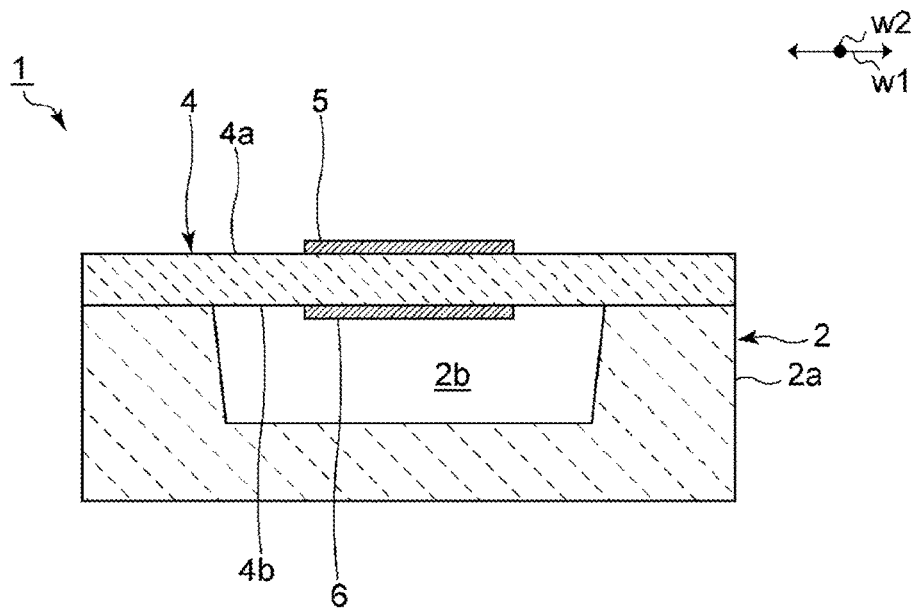
FIG. 2 is a sectional view taken along a line I-I in FIG. 1.

FIG. 1 is a plan view of an acoustic wave device according to a first exemplary embodiment of the present disclosure. FIG. 2 is a sectional view taken along a line I-I in FIG. 1. In FIG. 1 and FIG. 2, an extended wiring line and the like are omitted. The same applies to the drawings other than FIG. 1 and FIG. 2.

As illustrated in FIG. 1 and FIG. 2, an acoustic wave device 1 includes a support substrate 2, a piezoelectric layer 4, a first electrode 5, and a second electrode 6. As illustrated in FIG. 2, the support substrate 2 has a support portion 2a and a cavity 2b. The support substrate 2 supports the piezoelectric layer 4 at the support portion 2a. The support portion 2a has a frame shape. The cavity 2b is a recess provided in the support substrate 2. The cavity 2b is surrounded by the support portion 2a. Note that the cavity 2b may be a through-hole provided in the support substrate 2.

Examples of the material of the support substrate 2 include piezoelectric materials such as aluminum oxide, lithium tantalate, lithium niobate, and quartz; various ceramics such as alumina, sapphire, magnesia, silicon nitride, aluminum nitride, silicon carbide, zirconia, cordierite, mullite, steatite, and forsterite; dielectrics such as diamond and glass; semiconductors such as silicon and gallium nitride; and resins. Other materials are also possible without departing from the scope of the present disclosure.

The piezoelectric layer 4 has a first main surface 4a and a second main surface 4b. The first main surface 4a and the second main surface 4b are opposed to each other. The second main surface 4b is a main surface on a side of the support substrate 2. The piezoelectric layer 4 has a first direction w1 and a second direction w2. The second direction w2 is orthogonal to the first direction w1. Here, the piezoelectric layer 4 has anisotropy in a coefficient of linear expansion. In the piezoelectric layer 4, a coefficient of linear expansion in the first direction w1 is smaller than a coefficient of linear expansion in the second direction w2.

Specifically, the piezoelectric layer 4 of the present exemplary embodiment is a lithium niobate layer. More specifically, the piezoelectric layer 4 is made of Y-cut lithium niobate. Note that, in the present description, an expression that the piezoelectric layer 4 is made of lithium niobate also includes a case in which the piezoelectric layer 4 contains a small amount of impurities not affecting the electrical characteristics of the acoustic wave device 1. The first direction w1 corresponds to a Z-direction in a crystal axis direction. The second direction w2 corresponds to an X-direction in the crystal axis direction. Note that in the present exemplary embodiment, the first direction w1 is a direction in which the coefficient of linear expansion is smallest in the piezoelectric layer 4. On the other hand, the second direction w2 is a direction in which the coefficient of linear expansion is largest in the piezoelectric layer 4. However, the material of the piezoelectric layer 4 and the cutting direction are not limited to the above. For example, lithium tantalate, crystal, langasite, or the like may be used as the material of the piezoelectric layer 4.

The first electrode 5 is provided on the first main surface 4a of the piezoelectric layer 4. The second electrode 6 is provided on the second main surface 4b. The first electrode 5 and the second electrode 6 face each other with the piezoelectric layer 4 interposed therebetween. A portion where the first electrode 5, the second electrode 6, and the piezoelectric layer 4 overlap with each other in a plan view is an excitation portion. A bulk wave is excited in the excitation portion. The acoustic wave device 1 is a BAW (Bulk Acoustic Wave) element. Note that, in the present description, a plan view refers to a direction viewing from above in FIG. 2, that is, a direction viewing from a side of the first main surface 4a of the piezoelectric layer 4.

In the present exemplary embodiment, the first electrode 5 and the second electrode 6 do not face each other in a portion overlapping with the support portion 2a of the support substrate 2 in a plan view. On the other hand, the first electrode 5 and the second electrode 6 face each other in a portion overlapping with the cavity 2b in a plan view. Note that the first electrode 5 and the second electrode 6 may face each other in a portion overlapping with the support portion 2a of the support substrate 2 in a plan view.

As illustrated in FIG. 1, the piezoelectric layer 4 and the first electrode 5 have a rectangular shape in a plan view. The second electrode 6 as well has a rectangular shape in a plan view. Note that the shapes of the piezoelectric layer 4, the first electrode 5, and the second electrode 6 in a plan view are not limited to those described above, and may be a rhombus, an ellipse, or the like, for example. As such, the shape of the piezoelectric layer 4, the first electrode 5, and the second electrode 6, in a plan view, is not limiting upon the present disclosure.

Materials, such as W, Mo, Cr, Ti, Pt, Pd, Ni, Au, or the like, for example, may be used for the first electrode 5 and the second electrode 6. Note that the material of the first electrode 5 and the second electrode 6 is not limited to the above, and other materials may be used without departing from the scope of the present disclosure.

As illustrated in FIG. 2, the cavity 2b is provided between a portion of the piezoelectric layer 4 and a portion of the support substrate 2. In the cavity 2b, an excited acoustic wave does not propagate to the support substrate 2. With this, an acoustic wave may effectively be confined on a side of the piezoelectric layer 4. As described above, in the present embodiment, the cavity 2b is an energy confining portion.

As illustrated in FIG. 1 and FIG. 2, in the present exemplary embodiment, in the piezoelectric layer 4, the coefficient of linear expansion in the first direction w1 is smaller than the coefficient of linear expansion in the second direction w2, and the piezoelectric layer 4, the first electrode 5, and the second electrode 6 each extend in parallel with the first direction w1. Note that, in the present description, an expression that one direction and another direction are parallel to each other includes not only a case that an angle formed by the one direction and the other direction is 0°, but also a case that the angle is within a range of 0°±15°. Since the acoustic wave device 1 has the above-described configuration, warpage of the piezoelectric layer 4 may be suppressed. Details of this will be described below.

Figure 3:
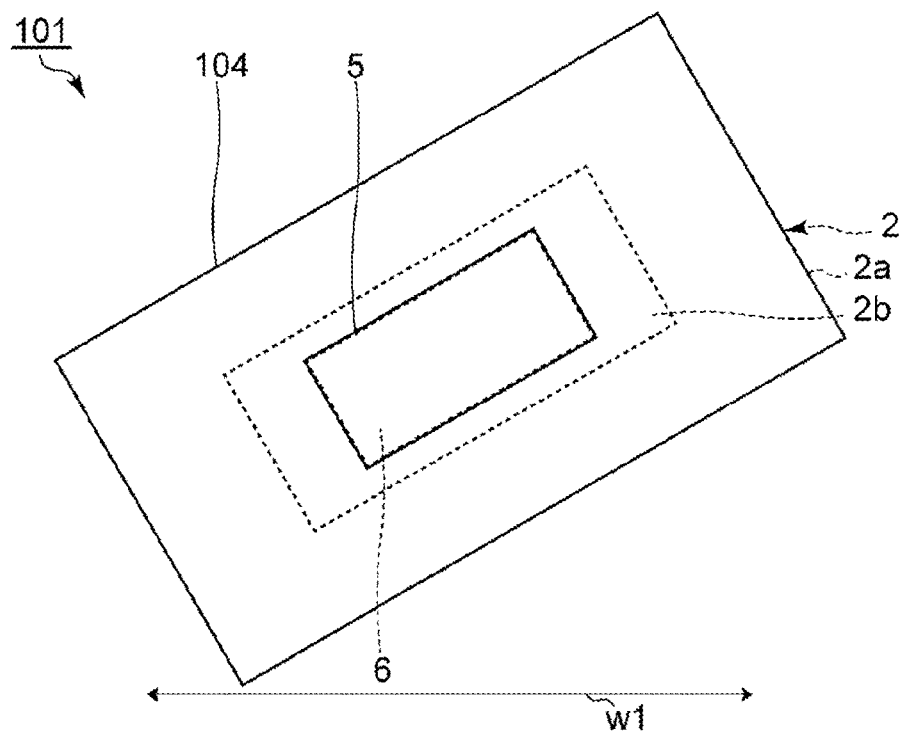
FIG. 3 is a plan view of an acoustic wave device of a comparative example.

FIG. 3 is a plan view of an acoustic wave device of a comparative example.

An acoustic wave device 101 of the comparative example is different from that of the first exemplary embodiment in that an extending direction of each of a piezoelectric layer 104, the first electrode 5, and the second electrode 6 is parallel to neither the first direction w1 nor the second direction w2. The acoustic wave device 101 expands or contracts because of a temperature change during a manufacturing process or during use, for example. Here, the piezoelectric layer 104 has anisotropy in a coefficient of linear expansion. As a result, the expansion or contraction of the piezoelectric layer 104 has unevenness. In addition, the piezoelectric layer 104 is not restrained in the energy confining portion. Consequently, in the comparative example, it is hard to suppress the warpage of the piezoelectric layer 104.

Meanwhile, in the acoustic wave device 1 in FIG. 2, the piezoelectric layer 4, the first electrode 5, and the second electrode 6 each extend in parallel with the first direction w1. As a result, each of the piezoelectric layer 4, the first electrode 5, and the second electrode 6 has a shape of reflection symmetry with respect to an axis extending in the first direction w1. Similarly, each of the piezoelectric layer 4, the first electrode 5, and the second electrode 6 has a shape of reflection symmetry with respect to an axis extending in the second direction w2, as well. As a result, even when the piezoelectric layer 4 has anisotropy in the coefficient of linear expansion, the unevenness is less likely to occur in expansion or contraction of the piezoelectric layer 4. Accordingly, the warpage of the piezoelectric layer 4 may be suppressed.

Note that it is sufficient that at least one of the piezoelectric layer 4, the first electrode 5, and the second electrode 6 extends in parallel with the first direction w1. However, it is preferable that the piezoelectric layer 4 extend in parallel with the first direction w1. In the case above, as aforementioned, the unevenness may effectively be made less likely to occur in expansion or contraction of the piezoelectric layer 4. On the other hand, even when the piezoelectric layer 4 does not extend in parallel with the first direction w1, when the first electrode 5 or the second electrode 6 extends in parallel with the first direction w1, the thermal distribution of the piezoelectric layer 4 is likely to have reflection symmetry with respect to the axis extending in the first direction w1. Consequently, the unevenness is less likely to occur in expansion or contraction of the piezoelectric layer 4. As in the present exemplary embodiment, it is more preferable that the piezoelectric layer 4, the first electrode 5, and the second electrode 6 each extend in parallel with the first direction w1. With this, the unevenness is further less likely to occur in expansion or contraction of the piezoelectric layer 4.

In the acoustic wave device 1, the piezoelectric layer 4, the first electrode 5, and the second electrode 6 each have reflection symmetry with respect to the axis extending in the first direction w1, and have reflection symmetry with respect to the axis extending in the second direction w2. As a result, the unevenness is further less likely to occur in expansion or contraction of the piezoelectric layer 4, and the warpage of the piezoelectric layer 4 may further be suppressed. However, it is acceptable that at least one of the piezoelectric layer 4, the first electrode 5, and the second electrode 6 has reflection symmetry with respect to the axis extending in the first direction w1, and has reflection symmetry with respect to the axis extending in the second direction w2.

Figure 4:
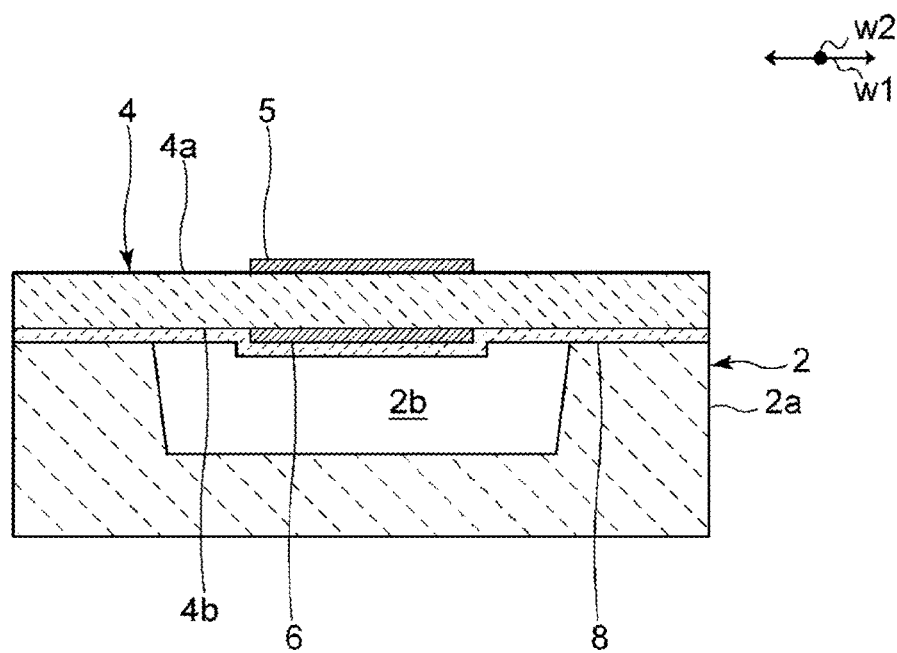
FIG. 4 is a front sectional view of an acoustic wave device according to a first modification of the first exemplary embodiment of the present disclosure.

FIG. 4 is a front sectional view of an acoustic wave device according to a first modification of the first exemplary embodiment.

Figure 17:
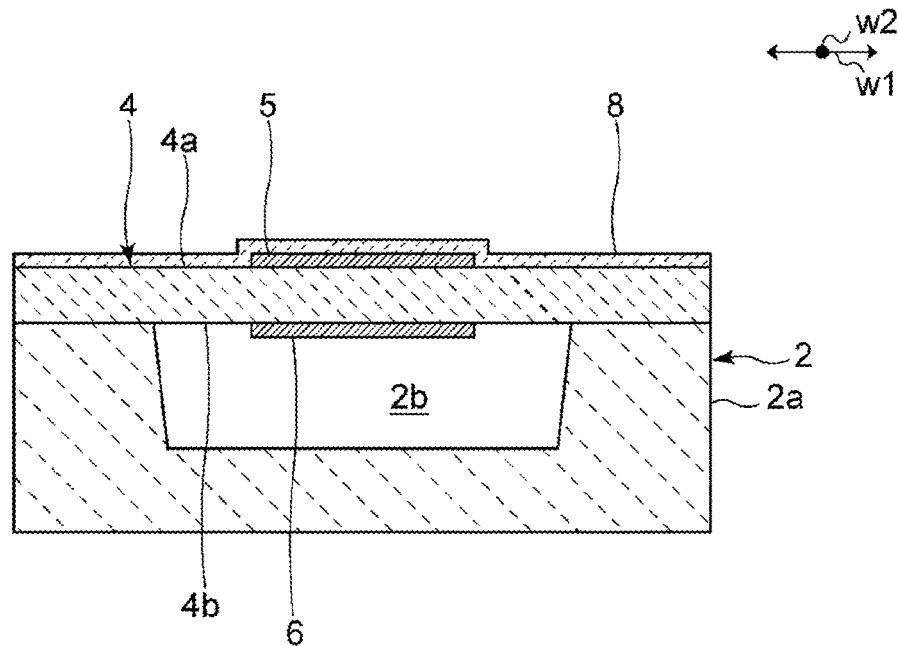
FIG. 17 is a front sectional view illustrating an example of an arrangement of a dielectric film in exemplary aspects of the present disclosure.
Figure 18:
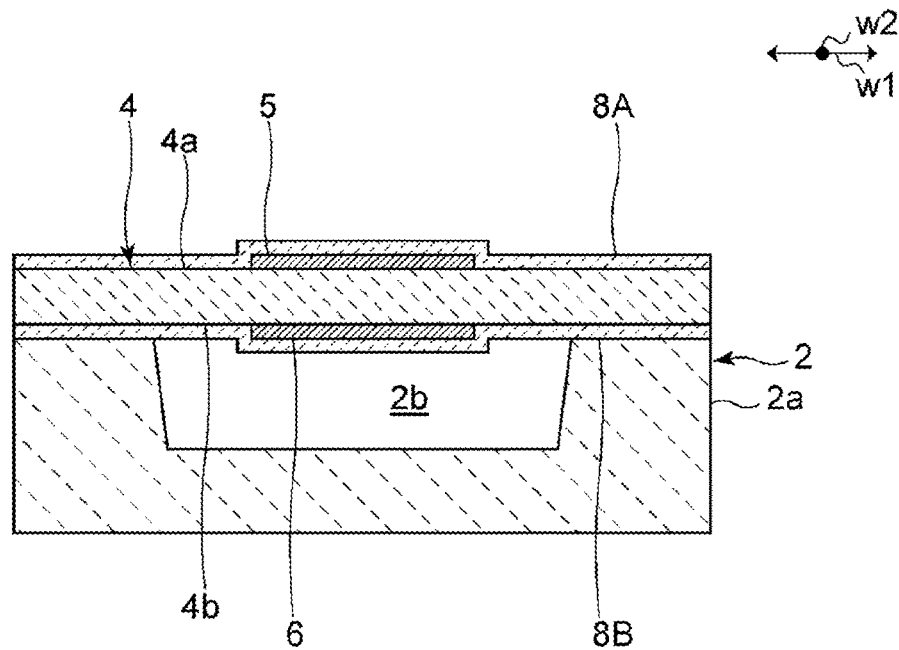
FIG. 18 is a front sectional view illustrating an example of an arrangement of a dielectric film in exemplary aspects of the present disclosure.
Figure 19:
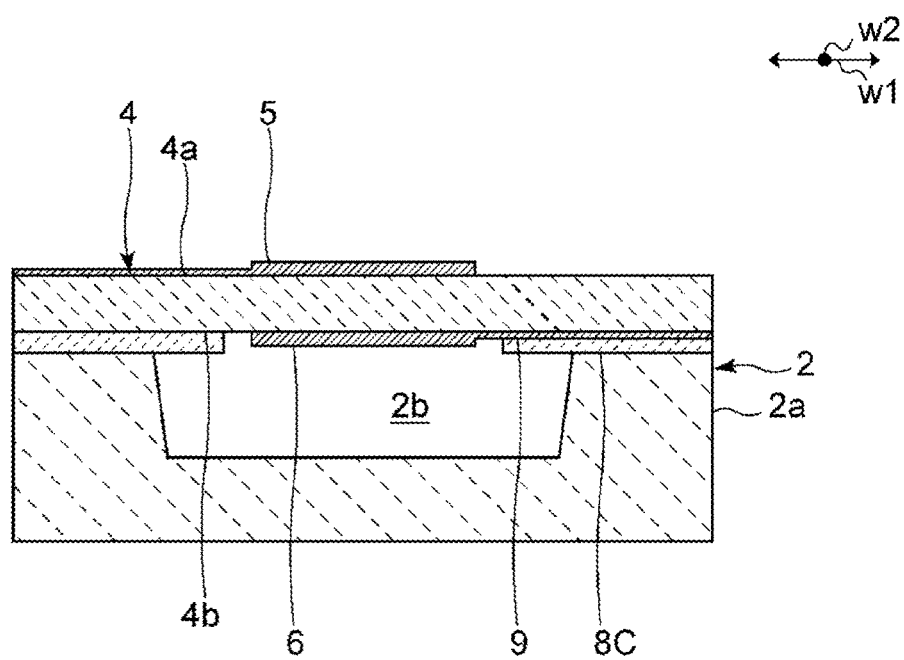
FIG. 19 is a front sectional view illustrating an example of an arrangement of a dielectric film in exemplary aspects of the present disclosure.

In the present modification, a dielectric film 8 is provided to cover the second electrode 6. With this, the second electrode 6 is less likely to be damaged. Note that, as illustrated in FIG. 17, a dielectric film 8 may be provided on the first main surface 4a of the piezoelectric layer 4 so as to cover the first electrode 5. In the case above, the first electrode 5 is less likely to be damaged. Alternatively, as illustrated in FIG. 18, it is acceptable that a dielectric film 8A is provided on the first main surface 4a so as to cover the first electrode 5, and a dielectric film 8B is provided on the second main surface 4b so as to cover the second electrode 6. As illustrated in FIG. 19, it is acceptable that a dielectric film 8C is provided on the second main surface 4b, does not cover the second electrode 6, and covers portions other than the second electrode 6. In the case above, the dielectric film 8C may cover a wiring electrode 9 connected to the second electrode 6, for example. The dielectric film 8C may have a frame shape, for example. Note that the wiring electrode 9 and the like are omitted in the drawings other than FIG. 19.

The arrangement of the first electrode 5 and the second electrode 6 is not limited to the arrangement in the first exemplary embodiment and the present modification. It is sufficient that the first electrode 5 and the second electrode 6 face each other on the cavity 2b.

When the configuration of the present modification is adopted, the warpage of the piezoelectric layer 4 may be suppressed the same as in the first exemplary embodiment. The coefficient of linear expansion of the dielectric film 8 is preferably smaller than the smaller one of the coefficient of linear expansion of the piezoelectric layer 4 in the first direction w1 and the coefficient of linear expansion of the piezoelectric layer 4 in the second direction w2. With this, the warpage of the piezoelectric layer 4 may effectively be suppressed.

Incidentally, the first electrode 5 and the second electrode 6 of the present exemplary embodiment in FIG. 2 are provided directly on the piezoelectric layer 4. The coefficient of linear expansion of each of the first electrode 5 and the second electrode 6 is smaller than the smaller one of the coefficient of linear expansion of the piezoelectric layer 4 in the first direction w1 and the coefficient of linear expansion of the piezoelectric layer 4 in the second direction w2. As described above, in the piezoelectric layer 4, the coefficient of linear expansion in the first direction w1 is smaller than the coefficient of linear expansion in the second direction w2. Further, in each of the piezoelectric layer 4, the first electrode 5, and the second electrode 6, a length along a direction parallel to the first direction w1 is larger than a length along a direction parallel to the second direction w2. The same applies to the first modification. Note that, it is acceptable that the coefficient of linear expansion of at least one of the first electrode 5 and the second electrode 6 is smaller than the smaller one of the coefficient of linear expansion of the piezoelectric layer 4 in the first direction w1 and the coefficient of linear expansion of the piezoelectric layer 4 in the second direction w2, and the electrode is directly provided on the piezoelectric layer 4.

In the first exemplary embodiment and the first modification thereof, the warpage of the piezoelectric layer 4 may effectively be suppressed by having the above-described configuration. Details of this will be described below.

In a multilayer structure illustrated in FIG. 4, a case of a high temperature was simulated. The simulation was performed in a state in which a support portion of a support substrate and a piezoelectric layer were not bonded to each other. Conditions of the simulation were the following conditions 1) and 2). Note that, in both 1) and 2), a coefficient of linear expansion of each of a first electrode, a second electrode, and a dielectric film is smaller than the smaller one of a coefficient of linear expansion of the piezoelectric layer in the first direction w1 and a coefficient of linear expansion of the piezoelectric layer in the second direction w2. Further, in each of the piezoelectric layer, the first electrode, and the second electrode, a length along a direction parallel to a first direction is larger than a length along a direction parallel to a second direction.

1) As in the first exemplary embodiment, in the piezoelectric layer, a coefficient of linear expansion in the first direction is smaller than a coefficient of linear expansion in the second direction. 2) In the piezoelectric layer, the coefficient of linear expansion in the first direction is larger than the coefficient of linear expansion in the second direction. In both 1) and 2), a case that the temperature was raised from 25° C. to 100° C. was simulated.

Figure 5:
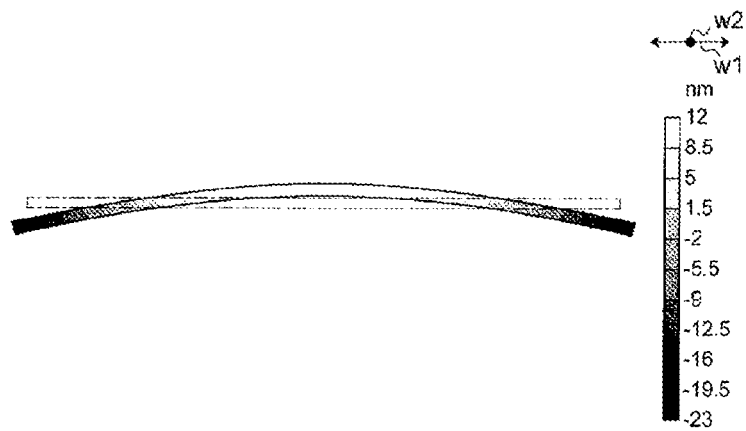
FIG. 5 is a diagram showing a result of a simulation regarding the warpage of a piezoelectric layer due to a temperature change, when an electrode and a dielectric film having a small coefficient of linear expansion are formed.

FIG. 5 is a diagram showing a result of a simulation when an electrode and a dielectric film having a small coefficient of linear expansion are formed. Note that FIG. 5 shows a result of a simulation under a configuration of the condition 1). A dashed-and-dotted line in FIG. 5 indicates a state of a multilayer body, configured of the piezoelectric layer and the second electrode, before a temperature change. Note that FIG. 5 shows a result of a case that the second electrode is provided on an entire second main surface of the piezoelectric layer. The warpage in the result shown in FIG. 5 refers to a distance between a line connecting both ends of the piezoelectric layer and a center of the piezoelectric layer.

As shown in FIG. 5, in the configuration of 1) above, the direction of the warpage of the piezoelectric layer is a direction in which a side of a first main surface protrudes. Although not illustrated, in the configuration of 2), the direction of the warpage is the same. In the configuration of 1), the warpage was 34 nm. On the other hand, in the configuration of 2), the warpage was 54 nm. As described above, it is understood that the warpage may be suppressed in the configuration of 1).

In the above 1) and 2), the coefficient of linear expansion of each of the first electrode, the second electrode, and the dielectric film is smaller than the smaller one of the coefficient of linear expansion of the piezoelectric layer in the first direction and the coefficient of linear expansion of the piezoelectric layer in the second direction. In the case above, the coefficient of linear expansion of the piezoelectric layer is dominant in the warpage of the multilayer body configured of the piezoelectric layer, the first electrode, the second electrode, and the dielectric film. Here, in 1), in the piezoelectric layer, the coefficient of linear expansion in the first direction is smaller than the coefficient of linear expansion in the second direction. As a result, the warpage may be reduced, in a case that the length along the direction parallel to the first direction is larger than the length along the direction parallel to the second direction in each of the piezoelectric layer, the first electrode, the second electrode, and the dielectric film. Accordingly, as described above, the warpage may be suppressed in the configuration of 1).

In the exemplary embodiment in FIG. 1, the coefficient of linear expansion of each of the first electrode 5 and the second electrode 6 is smaller than the smaller one of the coefficient of linear expansion of the piezoelectric layer 4 in the first direction w1 and the coefficient of linear expansion of the piezoelectric layer 4 in the second direction w2. In addition, in each of the piezoelectric layer 4, the first electrode 5, and the second electrode 6, a length along the direction parallel to the first direction w1 is larger than a length along the direction parallel to the second direction w2. Consequently, as in the case of 1), the warpage may be suppressed. Note that, it is sufficient that, in at least one of the piezoelectric layer 4, the first electrode 5, and the second electrode 6, the length along the direction parallel to the first direction w1 is larger than the length along the direction parallel to the second direction w2.

Incidentally, in the present exemplary embodiment, each of the first electrode 5 and the second electrode 6 is formed of a single-layer metal film. However, each of the first electrode 5 and the second electrode 6 may be formed of a multilayer metal film. In the case above, in the present description, when the coefficient of linear expansion of each of the first electrode 5 and the second electrode 6 is compared with the coefficient of linear expansion of the piezoelectric layer 4, the comparison needs to be based on the following criteria.

In a case that the first electrode 5 has a plurality of layers, when a thickness is dn and a coefficient of linear expansion is an in any layer, and a total thickness of the first electrode 5 is N, a reference coefficient of linear expansion of the first electrode 5 is the sum of $a_n \times d_n / N$ of all layers. Note that n is any natural number (1, 2, 3, . . . ). In the present description, when the reference coefficient of linear expansion of the first electrode 5 is larger than the larger one of the coefficient of linear expansion of the piezoelectric layer 4 in the first direction w1 and the coefficient of linear expansion of the piezoelectric layer 4 in the second direction w2, the coefficient of linear expansion of the first electrode 5 is decided to be larger than the above larger coefficient of linear expansion of the piezoelectric layer 4. When the reference coefficient of linear expansion of the first electrode 5 is smaller than the smaller one of the coefficient of linear expansion of the piezoelectric layer 4 in the first direction w1 and the coefficient of linear expansion of the piezoelectric layer 4 in the second direction w2, the coefficient of linear expansion of the first electrode 5 is decided to be smaller than the above smaller coefficient of linear expansion of the piezoelectric layer 4.

The same applies to the comparison between the coefficient of linear expansion of the second electrode 6 and the coefficient of linear expansion of the piezoelectric layer 4. More specifically, in a case that the second electrode 6 has a plurality of layers, when a thickness is dm and a coefficient of linear expansion is am in any layer, and a total thickness of the second electrode 6 is M, a reference coefficient of linear expansion of the second electrode 6 is the sum of $a_m \times d_m / M$ of all layers. Note that m is any natural number (1, 2, 3, . . . ). In the present description, when the reference coefficient of linear expansion of the second electrode 6 is larger than the larger one of the coefficient of linear expansion of the piezoelectric layer 4 in the first direction w1 and the coefficient of linear expansion of the piezoelectric layer 4 in the second direction w2, the coefficient of linear expansion of the second electrode 6 is decided to be larger than the above larger coefficient of linear expansion of the piezoelectric layer 4. When the reference coefficient of linear expansion of the second electrode 6 is smaller than the smaller one of the coefficient of linear expansion of the piezoelectric layer 4 in the first direction w1 and the coefficient of linear expansion of the piezoelectric layer 4 in the second direction w2, the coefficient of linear expansion of the second electrode 6 is decided to be smaller than the above smaller coefficient of linear expansion of the piezoelectric layer 4.

The configuration of the present exemplary embodiment is equivalent to a configuration having the following first to third features. First, the coefficient of linear expansion of each of the first electrode 5 and the second electrode 6 is smaller than the smaller one of the coefficient of linear expansion of the piezoelectric layer 4 in the first direction w1 and the coefficient of linear expansion of the piezoelectric layer 4 in the second direction w2. Secondly, in the piezoelectric layer 4, the coefficient of linear expansion in the second direction w2 is smaller than the coefficient of linear expansion in the first direction w1. Thirdly, in at least one of the piezoelectric layer 4, the first electrode 5, and the second electrode 6, a length along the second direction w2 is larger than a length along the first direction w1.

In the present exemplary embodiment, the first electrode and the second electrode are directly provided on the piezoelectric layer 4. However, the first electrode or the second electrode may indirectly be provided on the piezoelectric layer 4. Hereinafter, a second modification and a third modification of the first exemplary embodiment, which are different from the first exemplary embodiment only in that an intermediate film is provided, will be described. In the second modification and the third modification as well, the warpage of the piezoelectric layer 4 may be suppressed the same as in the first exemplary embodiment.

Figure 6:
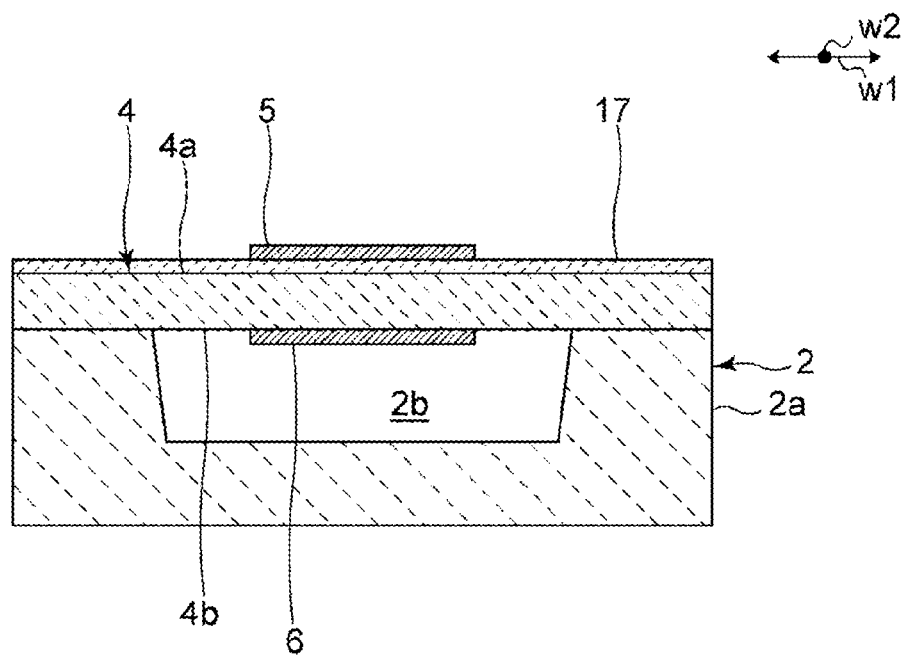
FIG. 6 is a front sectional view of an acoustic wave device according to a second modification of the first exemplary embodiment of the present disclosure.

In the second modification in FIG. 6, an intermediate film 17 is provided between the piezoelectric layer 4 and the first electrode 5. The first electrode 5 is indirectly provided on the piezoelectric layer 4 with the intermediate film 17 interposed therebetween. A coefficient of linear expansion of the intermediate film 17 is preferably smaller than the maximum coefficient of linear expansion of the piezoelectric layer 4. A metal such as W, Mo, Pt, or Ti, or a dielectric such as $SiO_2$ or alumina, for example, may be used for the intermediate film 17. Other metals are also possible, as one of ordinary skill would recognize.

When the intermediate film 17 is made of a metal, the warpage of the piezoelectric layer 4 may be reduced, and the resistance on a side of the first electrode 5 may be decreased. When the intermediate film 17 is made of $SiO_2$, the warpage of the piezoelectric layer 4 may be reduced. In addition, an absolute value of temperature coefficient of frequency (TCF) may be reduced, and thus, frequency-temperature characteristics may be improved.

On the other hand, the second electrode 6 is directly provided on the piezoelectric layer 4. Note that an intermediate film 17 may be provided between the piezoelectric layer 4 and the second electrode 6. In the case above, the first electrode 5 may directly be provided on the piezoelectric layer 4.

Figure 7:
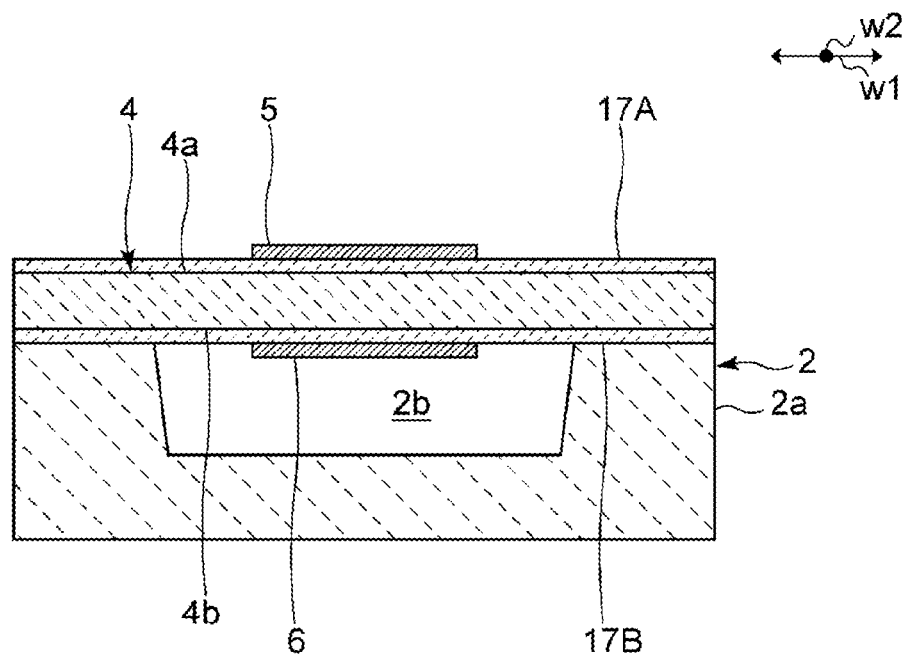
FIG. 7 is a front sectional view of an acoustic wave device according to a third modification of the first exemplary embodiment of the present disclosure.

In the third modification in FIG. 7, a first intermediate film 17A is provided between the piezoelectric layer 4 and the first electrode 5. A second intermediate film 17B is provided between the piezoelectric layer 4 and the second electrode 6. The first electrode 5 is indirectly provided on the piezoelectric layer 4 with the first intermediate film 17A interposed therebetween. The second electrode 6 is indirectly provided on the piezoelectric layer 4 with the second intermediate film 17B interposed therebetween. The coefficient of linear expansion of each of the first intermediate film 17A and the second intermediate film 17B is smaller than the maximum coefficient of linear expansion of the piezoelectric layer 4. For the first intermediate film 17A and the second intermediate film 17B, a material similar to that of the intermediate film 17 in the second modification may be used. In the case above as well, it is sufficient that, in at least one of the piezoelectric layer 4, the first electrode 5, and the second electrode 6, the length along the direction parallel to the first direction w1 is larger than the length along the direction parallel to the second direction w2. However, in the piezoelectric layer 4, it is preferable that the length along the first direction w1 be larger than the length along the second direction w2.

In the first exemplary embodiment, each of the piezoelectric layer 4, the first electrode 5, and the second electrode 6 has a rectangular shape in a plan view. Hereinafter, a fourth modification and a fifth modification of the first exemplary embodiment, which are different from the first exemplary embodiment only in the shapes of the piezoelectric layer, the first electrode, and the second electrode in a plan view, will be described below. In the fourth modification and the fifth modification as well, the warpage of the piezoelectric layer may be suppressed the same as in the first exemplary embodiment.

Figure 8:
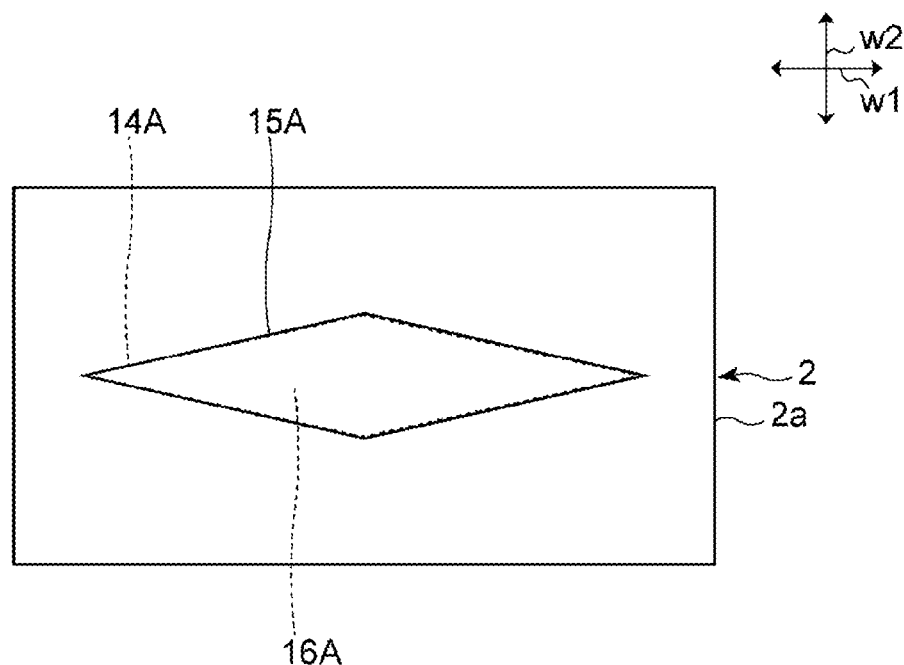
FIG. 8 is a plan view of an acoustic wave device according to a fourth modification of the first exemplary embodiment of the present disclosure.

In the fourth modification in FIG. 8, each of a piezoelectric layer 14A, a first electrode 15A, and a second electrode 16A has a rhombic shape in a plan view. A major axis (the longest straight line among straight lines connecting opposing vertexes or sides) of each of the piezoelectric layer 14A, the first electrode 15A, and the second electrode 16A extends in parallel with the first direction w1. A minor axis (the shortest straight line among straight lines connecting opposing vertexes or sides) of each of the piezoelectric layer 14A, the first electrode 15A, and the second electrode 16A extends in parallel with the second direction w2.

Note that the shape of each of the piezoelectric layer, the first electrode, and the second electrode in a plan view may be a polygon other than a quadrangle. In the case above, it is preferable that the number of vertexes be an even number. With this, the above-described shapes may have reflection symmetry with respect to both an axis extending in parallel with the first direction w1 and an axis extending in parallel with the second direction w2. Note that, in each of the above-described shapes, a portion corresponding to a vertex of a polygon may be formed in an "R-shape". In the present description, the "R-shape" means that a corner portion has a curved shape.

Figure 9:
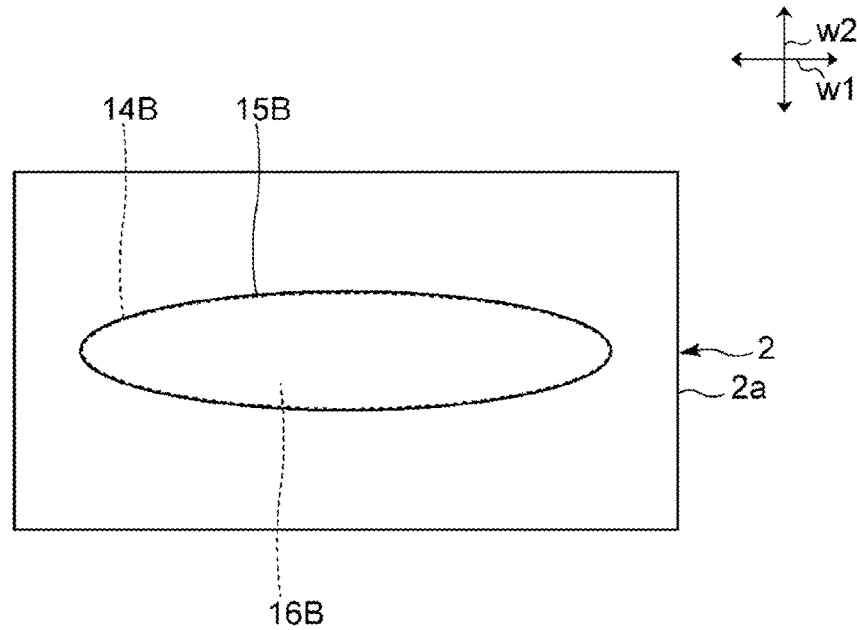
FIG. 9 is a plan view of an acoustic wave device according to a fifth modification of the first exemplary embodiment of the present disclosure.

In the fifth modification in FIG. 9, each of a piezoelectric layer 14B, a first electrode 15B, and a second electrode 16B has an elliptical shape in a plan view. A major axis of each of the piezoelectric layer 14B, the first electrode 15B, and the second electrode 16B extends in parallel with the first direction w1. A minor axis of each of the piezoelectric layer 14B, the first electrode 15B, and the second electrode 16B extends in parallel with the second direction w2.

Figure 10:
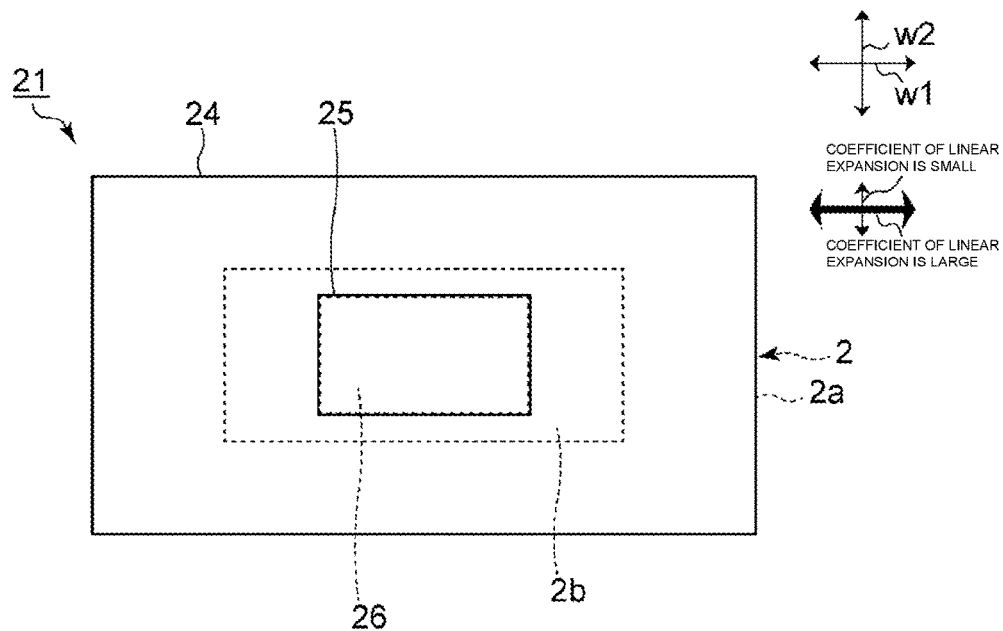
FIG. 10 is a plan view of an acoustic wave device according to a second exemplary embodiment of the present disclosure.

FIG. 10 is a plan view of an acoustic wave device according to a second exemplary embodiment of the present disclosure.

As illustrated in FIG. 10, the present exemplary embodiment is different from the first exemplary embodiment in that, in a piezoelectric layer 24, a coefficient of linear expansion in the first direction w1 is larger than a coefficient of linear expansion in the second direction w2. Further, the present exemplary embodiment is different from the first exemplary embodiment in that a coefficient of linear expansion of each of a first electrode 25 and a second electrode 26 is larger than the larger one of a coefficient of linear expansion of the piezoelectric layer 24 in the first direction w1 and the coefficient of linear expansion of the piezoelectric layer 24 in the second direction w2. Except for the points above, an acoustic wave device 21 of the present exemplary embodiment has a configuration similar to that of the acoustic wave device 1 of the first exemplary embodiment.

In the present exemplary embodiment as well, each of the piezoelectric layer 24, the first electrode 25, and the second electrode 26 has a shape of reflection symmetry with respect to the axis extending in parallel with the first direction w1.

As a result, even when the piezoelectric layer 24 has anisotropy in the coefficient of linear expansion, the unevenness is less likely to occur in expansion or contraction of the piezoelectric layer 24. Accordingly, the warpage of the piezoelectric layer 24 may be suppressed.

In the present exemplary embodiment, the first electrode 25 and the second electrode 26 are directly provided on the piezoelectric layer 24. As described above, the coefficient of linear expansion of each of the first electrode 25 and the second electrode 26 is larger than the larger one of the coefficient of linear expansion of the piezoelectric layer 24 in the first direction w1 and the coefficient of linear expansion of the piezoelectric layer 24 in the second direction w2. Further, in the piezoelectric layer 24, the coefficient of linear expansion in the first direction w1 is larger than the coefficient of linear expansion in the second direction w2. In each of the piezoelectric layer 24, the first electrode 25, and the second electrode 26, a length along the direction parallel to the first direction w1 is larger than a length along the direction parallel to the second direction w2.

Note that, it is acceptable that the coefficient of linear expansion of at least one of the first electrode 25 and the second electrode 26 is larger than the larger one of the coefficient of linear expansion of the piezoelectric layer 24 in the first direction w1 and the coefficient of linear expansion of the piezoelectric layer 24 in the second direction w2, and the electrode is directly provided on the piezoelectric layer 24.

Incidentally, even in a case of a relationship between a coefficient of linear expansion and a length as in the present exemplary embodiment, the multilayer structure similar to that of the first modification of the first exemplary embodiment may be adopted. In the case above as well, the warpage of the piezoelectric layer 24 may be suppressed.

In a multilayer structure similar to that in FIG. 4, a case of a high temperature was simulated. The simulation was performed in a state in which a support portion of a support substrate and a piezoelectric layer were not bonded to each other. Conditions of the simulation were the following conditions 3) and 4). Note that, in both 3) and 4), a coefficient of linear expansion of a second electrode is larger than the larger one of a coefficient of linear expansion of a piezoelectric layer in a first direction and a coefficient of linear expansion of the piezoelectric layer in a second direction. On the other hand, a coefficient of linear expansion of each of a first electrode and a dielectric film is smaller than the smaller one of the coefficient of linear expansion of the piezoelectric layer in the first direction and the coefficient of linear expansion of the piezoelectric layer in the second direction. In each of the piezoelectric layer, the first electrode, and the second electrode, a length along a direction parallel to the first direction is larger than a length along a direction parallel to the second direction.

Figure 11:
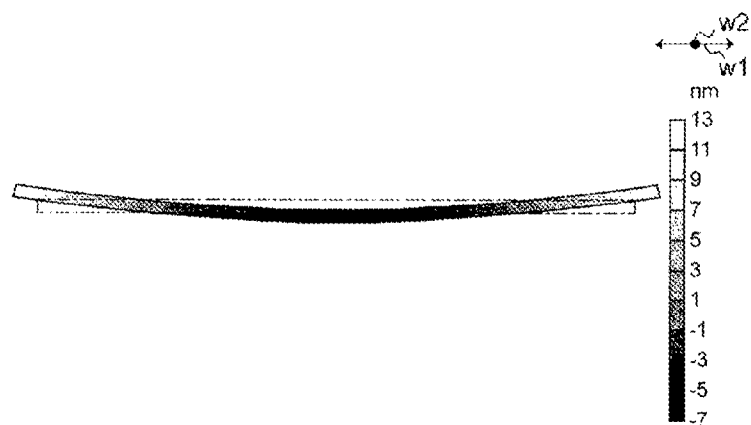
FIG. 11 is a diagram showing a result of a simulation regarding the warpage of a piezoelectric layer due to a temperature change, when an electrode and a dielectric film having a large coefficient of linear expansion are formed.

3) As in the present exemplary embodiment, in the piezoelectric layer, the coefficient of linear expansion in the first direction is larger than the coefficient of linear expansion in the second direction. 4) In the piezoelectric layer, the coefficient of linear expansion in the first direction is smaller than the coefficient of linear expansion in the second direction. FIG. 11 shows a result of a simulation in the case 3). In both 3) and 4), a case in which the temperature was raised from 25° C. to 100° C. was simulated.

FIG. 11 is a diagram showing a result of a simulation when an electrode and a dielectric film having a large coefficient of linear expansion are formed. Note that FIG. 11 shows a result of a simulation under a configuration of the condition 3). A dashed-and-dotted line in FIG. 11 indicates a state of a multilayer body, configured of the piezoelectric layer and the second electrode, before a temperature change. The warpage in the result shown in FIG. 11 refers to a distance between a line connecting both ends of the piezoelectric layer and a center of the piezoelectric layer.

As shown in FIG. 11, in the configuration of 3) above, the direction of the warpage of the piezoelectric layer is a direction in which a side of a second main surface protrudes. Although not illustrated, in the configuration of 4), the direction of the warpage is the same. In the configuration of 3), the warpage was 19 nm. On the other hand, in the configuration of 4), the warpage was 73 nm. As described above, it is understood that the warpage may be suppressed in the configuration of 3).

In 3) and 4) above, the coefficient of linear expansion of the second electrode is larger than the maximum coefficient of linear expansion of the piezoelectric layer. In the case above, the warpage of the second electrode cannot be ignored in comparison with the warpage of the multilayer body configured of the piezoelectric layer, the first electrode, the second electrode, and the dielectric film. Here, in 4), in the piezoelectric layer, the coefficient of linear expansion in the first direction is smaller than the coefficient of linear expansion in the second direction. As a result, in the direction parallel to the first direction, the difference in coefficient of linear expansion between the second electrode and the piezoelectric layer is large. Further, the length of each of the piezoelectric layer and the second electrode along the direction parallel to the first direction is larger than the length along the second direction. Consequently, the influence of the warpage due to the second electrode becomes large. As a result, in the configuration of 4), it is hard to suppress the warpage of the multilayer body configured of the piezoelectric layer, the first electrode, the second electrode, and the dielectric film.

Meanwhile, in 3), in the piezoelectric layer, the coefficient of linear expansion in the first direction is larger than the coefficient of linear expansion in the second direction. As a result, in the direction parallel to the first direction, the difference in the coefficient of linear expansion between the second electrode and the piezoelectric layer is small. Further, the length of each of the piezoelectric layer and the second electrode along the direction parallel to the first direction is larger than the length along the second direction. Consequently, the warpage caused by the second electrode may effectively be canceled by the warpage caused by the piezoelectric layer. Accordingly, as described above, the warpage may be suppressed in the configuration of 3).

In the present exemplary embodiment, the coefficient of linear expansion of each of the first electrode 25 and the second electrode 26 is larger than the larger one of the coefficient of linear expansion of the piezoelectric layer 24 in the first direction w1 and the coefficient of linear expansion of the piezoelectric layer 24 in the second direction w2. In addition, in each of the piezoelectric layer 24, the first electrode 25, and the second electrode 26, the length along the direction parallel to the first direction w1 is larger than the length along the direction parallel to the second direction w2. Consequently, as in the case of 3), the warpage may be suppressed. Note that, it is sufficient that, in at least one of the piezoelectric layer 24, the first electrode 25, and the second electrode 26, the length along the direction parallel to the first direction w1 is larger than the length along the direction parallel to the second direction w2. Further, when the piezoelectric layer 24 is made of lithium niobate or lithium tantalate, it is preferable to use Al, Ag, Mg, Sn, or the like as the first electrode 25 and the second electrode 26 each having a coefficient of linear expansion larger than the maximum coefficient of linear expansion of the piezoelectric layer 24. Of course, other materials may be used for the first electrode 25 and second electrode 26 without departing from the scope of the present disclosure.

The configuration of the present exemplary embodiment is equivalent to a configuration including the following first to third features. First, the coefficient of linear expansion of each of the first electrode 25 and the second electrode 26 is larger than the larger one of the coefficient of linear expansion of the piezoelectric layer 24 in the first direction w1 and the coefficient of linear expansion of the piezoelectric layer 24 in the second direction w2. Secondly, in the piezoelectric layer 24, the coefficient of linear expansion in the second direction w2 is larger than the coefficient of linear expansion in the first direction w1. Thirdly, in at least one of the piezoelectric layer 24, the first electrode 25, and the second electrode 26, the length along the second direction w2 is larger than the length along the first direction w1.

As in the second modification of the first exemplary embodiment, an intermediate film may be provided between the piezoelectric layer 24 and at least one of the first electrode 25 and the second electrode 26. A coefficient of linear expansion of the intermediate film is preferably larger than the maximum coefficient of linear expansion of the piezoelectric layer 24. A metal such as Al, Ag, Mg, or Sn, or a resin or the like, for example, may be used as the intermediate film above. However, other materials may also be used as one of ordinary skill would recognize.

As in the third modification of the first exemplary embodiment, it is acceptable that a first intermediate film is provided between the piezoelectric layer 24 and the first electrode 25, and a second intermediate film is provided between the piezoelectric layer 24 and the second electrode 26. A coefficient of linear expansion of each of the first intermediate film and the second intermediate film is larger than the maximum coefficient of linear expansion of the piezoelectric layer 24. In the case above as well, it is sufficient that, in at least one of the piezoelectric layer 24, the first electrode 25, and the second electrode 26, the length along the direction parallel to the first direction w1 is larger than the length along the direction parallel to the second direction w2. However, in the piezoelectric layer 24, it is preferable that the length along the first direction w1 be larger than the length along the second direction w2.

In the exemplary embodiments described above, the energy confining portion is the cavity 2b provided in the support substrate 2. However, the energy confining portion is not limited thereto. Hereinafter, exemplary embodiments in which the energy confining portion is different from the first exemplary embodiment will be described below. Note that, in the following exemplary embodiments, as in the first exemplary embodiment, in a piezoelectric layer, a coefficient of linear expansion in a first direction is smaller than a coefficient of linear expansion in a second direction, and a coefficient of linear expansion of each of a first electrode and a second electrode is smaller than the smaller one of the coefficient of linear expansion of the piezoelectric layer in the first direction w1 and the coefficient of linear expansion of the piezoelectric layer in the second direction w2. However, as in the second exemplary embodiment, in the piezoelectric layer, it is acceptable that the coefficient of linear expansion in the first direction is larger than the coefficient of linear expansion in the second direction, and the coefficient of linear expansion of each of the first electrode and the second electrode is larger than the coefficient of linear expansion of the piezoelectric layer in the first direction.

Figure 12:
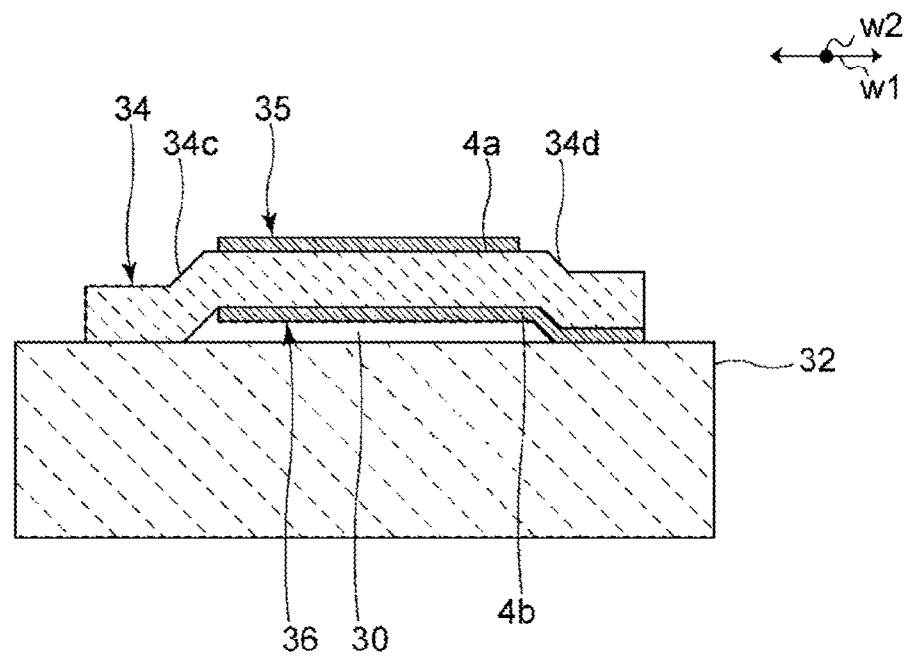
FIG. 12 is a front sectional view of an acoustic wave device according to a third exemplary embodiment of the present disclosure.

FIG. 12 is a front sectional view of an acoustic wave device according to a third exemplary embodiment of the present disclosure.

In the present exemplary embodiment, a piezoelectric layer 34 has a bent portion 34c and a bent portion 34d. With this, a cavity 30 is provided between a support substrate 32 and the piezoelectric layer 34. The cavity 30 is an energy confining portion in the present exemplary embodiment. On the other hand, the support substrate 32 has neither a recess nor a through-hole. A first electrode 35 and a second electrode 36 face each other in a portion overlapping with the cavity 30 in a plan view. In the present exemplary embodiment as well, the warpage of the piezoelectric layer 34 may be suppressed the same as in the first exemplary embodiment.

Figure 13:
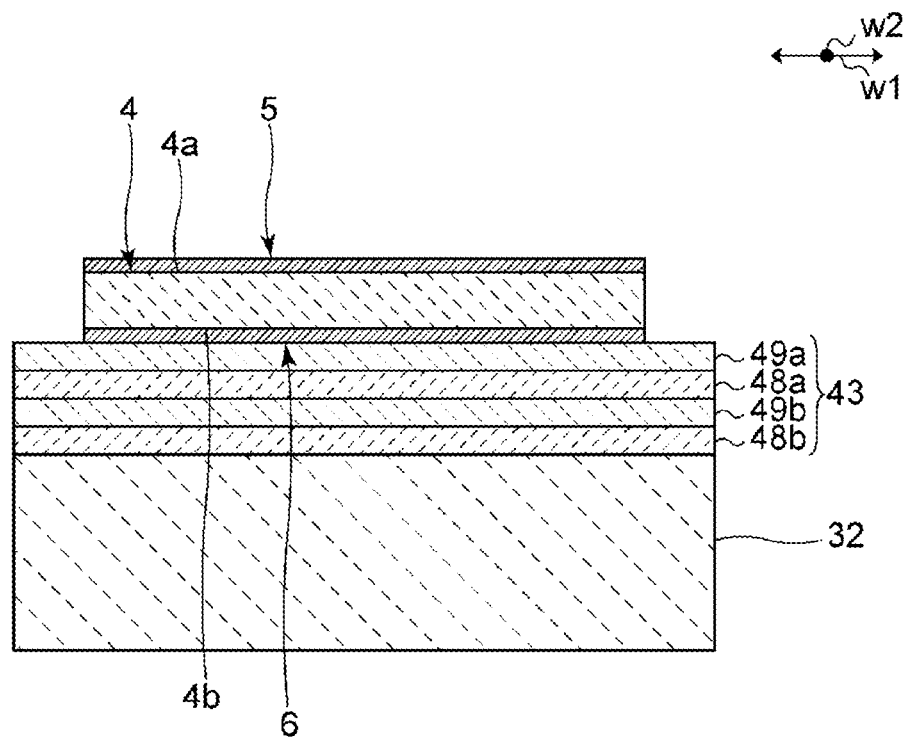
FIG. 13 is a front sectional view of an acoustic wave device according to a fourth exemplary embodiment of the present disclosure.

FIG. 13 is a front sectional view of an acoustic wave device according to a fourth exemplary embodiment of the present disclosure.

In the present exemplary embodiment, an acoustic reflection film 43 is provided between the support substrate 32 and the piezoelectric layer 4. The acoustic reflection film 43 is an energy confining portion in the present exemplary embodiment. The support substrate 32 has neither a recess nor a through-hole. Note that a recess may be provided in the support substrate 32. The acoustic reflection film 43 may be provided inside a recess of the support substrate 32.

The acoustic reflection film 43 is a multilayer body configured of a plurality of acoustic impedance layers. More specifically, the acoustic reflection film 43 includes a plurality of low acoustic impedance layers and a plurality of high acoustic impedance layers. The low acoustic impedance layer is a layer having a relatively low acoustic impedance. The plurality of low acoustic impedance layers in the acoustic reflection film 43 includes a low acoustic impedance layer 49a and a low acoustic impedance layer 49b. On the other hand, the high acoustic impedance layer is a layer having a relatively high acoustic impedance. The plurality of high acoustic impedance layers in the acoustic reflection film 43 includes a high acoustic impedance layer 48a and a high acoustic impedance layer 48b. The low acoustic impedance layers and the high acoustic impedance layers are alternately laminated. Note that the low acoustic impedance layer 49a is a layer positioned closest to a side of the piezoelectric layer 4 in the acoustic reflection film 43.

The acoustic reflection film 43 includes two low acoustic impedance layers and two high acoustic impedance layers. However, it is sufficient that the acoustic reflection film 43 includes at least one of each of the low acoustic impedance layer and the high acoustic impedance layer.

As a material of the low acoustic impedance layer, silicon oxide, aluminum, or the like, for example, may be used. As a material of the high acoustic impedance layer, a metal such as platinum or tungsten, or a dielectric such as aluminum nitride or silicon nitride, for example, may be used. Other materials are also possible without departing from the scope of the present disclosure. In the present exemplary embodiment as well, the warpage of the piezoelectric layer 4 may be suppressed the same as in the first exemplary embodiment.

Figure 14:
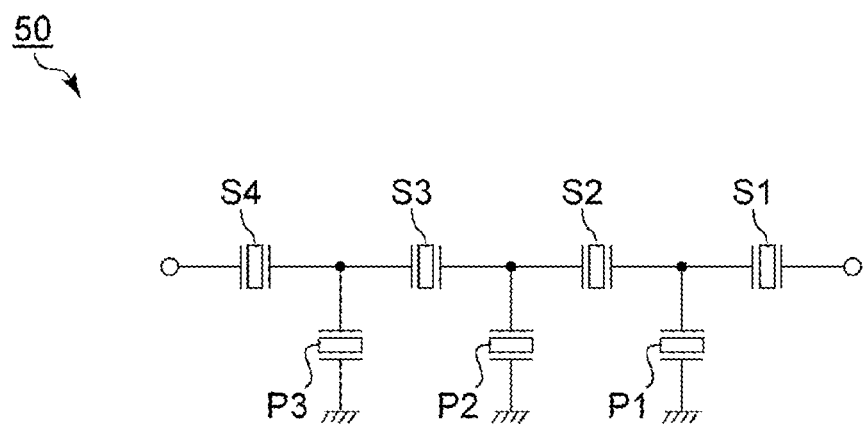
FIG. 14 is a circuit diagram of a filter device according to a fifth exemplary embodiment of the present disclosure.

FIG. 14 is a circuit diagram of a filter device according to a fifth exemplary embodiment.

A filter device 50 is a ladder filter including the acoustic wave device according to the present disclosure. The filter device 50 includes a plurality of series arm resonators and a plurality of parallel arm resonators. More specifically, series arm resonators S1, S2, S3, and S4 are connected in series. A parallel arm resonator P1 is connected between a ground electric potential and a connection point of the series arm resonator S1 and the series arm resonator S2. A parallel arm resonator P2 is connected between the ground electric potential and a connection point of the series arm resonator S2 and the series arm resonator S3. A parallel arm resonator P3 is connected between the ground electric potential and a connection point of the series arm resonator S3 and the series arm resonator S4.

In the present exemplary embodiment, all the series arm resonators and the parallel arm resonators are acoustic wave devices according to the present disclosure. However, it is sufficient that at least one series arm resonator or at least one parallel arm resonator in the filter device 50 is the acoustic wave device according to the present disclosure.

Figure 15:
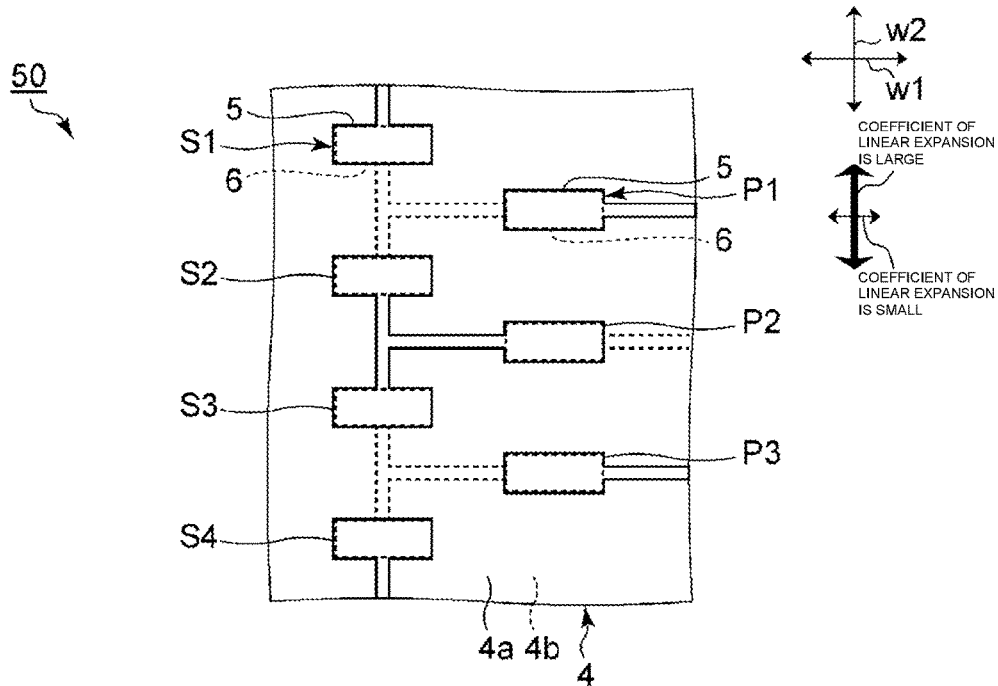
FIG. 15 is a schematic plan view of the filter device according to the fifth exemplary embodiment of the present disclosure illustrating a portion thereof.

FIG. 15 is a schematic plan view of a filter device according to the fifth exemplary embodiment illustrating a portion thereof.

The plurality of series arm resonators and the plurality of parallel arm resonators in the filter device 50 share the piezoelectric layer 4 similar to that of the first exemplary embodiment. In the piezoelectric layer 4, the coefficient of linear expansion in the first direction w1 is smaller than the coefficient of linear expansion in the second direction w2. In the present exemplary embodiment, all the series arm resonators and all the parallel arm resonators have the first electrode 5 and second electrode 6 similar to those of the first exemplary embodiment. The coefficient of linear expansion of each of the first electrode 5 and the second electrode 6 is smaller than the smaller one of the coefficient of linear expansion of the piezoelectric layer 4 in the first direction w1 and the coefficient of linear expansion of the piezoelectric layer 4 in the second direction w2. A length of each of the first electrode 5 and the second electrode 6 of all the series arm resonators and all the parallel arm resonators along the first direction w1 is larger than a length thereof along the second direction w2. With this, in all the series arm resonators and all the parallel arm resonators, the warpage of the piezoelectric layer 4 may be suppressed.

Figure 16:
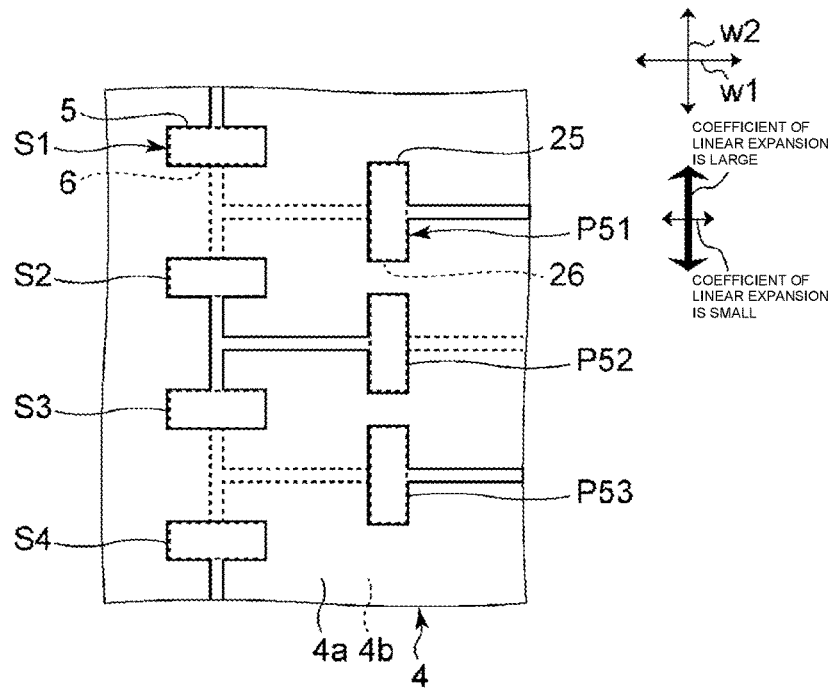
FIG. 16 is a schematic plan view of a filter device according to a modification of the fifth exemplary embodiment of the present disclosure illustrating a portion thereof.

Note that the configurations of the first electrode and the second electrode are not required to be the same in all the series arm resonators and all the parallel arm resonators. For example, in a modification of the fifth exemplary embodiment in FIG. 16, a configuration of the first electrode and the second electrode in the series arm resonator and a configuration of the first electrode and the second electrode in the parallel arm resonator are different from each other. More specifically, each of all the series arm resonators has the first electrode 5 and the second electrode 6 similar to those of the first exemplary embodiment. On the other hand, each of all the parallel arm resonators, that is, each of parallel arm resonators P51, P52, and P53 has the first electrode 25 and the second electrode 26 similar to those of the second exemplary embodiment.

Each of the first electrode 5 and the second electrode 6 in each series arm resonator is configured in the same manner as in the first exemplary embodiment and the fifth exemplary embodiment. On the other hand, each of the first electrode 25 and the second electrode 26 in each parallel arm resonator has a configuration equivalent to that of the second exemplary embodiment. More specifically, the coefficient of linear expansion of each of the first electrode 25 and the second electrode 26 in each of the parallel arm resonators is larger than the larger one of the coefficient of linear expansion of the piezoelectric layer 4 in the first direction w1 and the coefficient of linear expansion of the piezoelectric layer 4 in the second direction w2. In the piezoelectric layer 4, the coefficient of linear expansion in the second direction w2 is larger than the coefficient of linear expansion in the first direction w1. A length of each of the first electrode 25 and second electrode 26 of each of the parallel arm resonators along the second direction w2 is larger than a length thereof along the first direction w1. In the present modification as well, in all the series arm resonators and all the parallel arm resonators, the warpage of the piezoelectric layer 4 may be suppressed.

REFERENCE SIGNS LIST

104 ACOUSTIC WAVE DEVICE
2 SUPPORT SUBSTRATE
2a SUPPORT PORTION
2b CAVITY
4 PIEZOELECTRIC LAYER
4a, 4b FIRST AND SECOND MAIN SURFACES
5, 6 FIRST AND SECOND ELECTRODES
8, 8A, 8B DIELECTRIC FILM
9 WIRING ELECTRODE
14A, 14B PIEZOELECTRIC LAYER
15A, 15B FIRST ELECTRODE
16A, 16B SECOND ELECTRODE
17 INTERMEDIATE FILM
17A, 17B FIRST AND SECOND INTERMEDIATE FILMS
21 ACOUSTIC WAVE DEVICE
24 PIEZOELECTRIC LAYER
25, 26 FIRST AND SECOND ELECTRODES
30 CAVITY
32 SUPPORT SUBSTRATE
34 PIEZOELECTRIC LAYER
34c, 34d BENT PORTION
35, 36 FIRST AND SECOND ELECTRODES
43 ACOUSTIC REFLECTION FILM
48a, 48b HIGH ACOUSTIC IMPEDANCE LAYER
49a, 49b LOW ACOUSTIC IMPEDANCE LAYER
50 FILTER DEVICE
101 ACOUSTIC WAVE DEVICE
104 PIEZOELECTRIC LAYER
P1 to P3, P51 to P53 PARALLEL ARM RESONATOR
S1 to S4 SERIES ARM RESONATOR

The invention claimed is:

1. An acoustic wave device, comprising:
a support substrate;
a piezoelectric layer provided on the support substrate and having a first main surface opposite to a second main surface, the piezoelectric layer including a first direction orthogonal to a second direction;
a first electrode provided on the first main surface of the piezoelectric layer;
a second electrode provided on the second main surface of the piezoelectric layer and configured to face the first electrode; and
an energy confining portion provided between the support substrate and the piezoelectric layer,
wherein the piezoelectric layer is anisotropic with respect to a coefficient of linear expansion, and a coefficient of linear expansion of the piezoelectric layer in the first direction is different from a coefficient of linear expansion of the piezoelectric layer in the second direction, and
at least one of the piezoelectric layer, the first electrode, and the second electrode is parallel to the first direction.

2. The acoustic wave device according to claim 1,
wherein a coefficient of linear expansion of at least one electrode of the first electrode and the second electrode is smaller than a smaller one of the coefficient of linear expansion of the piezoelectric layer in the first direction and the coefficient of linear expansion of the piezoelectric layer in the second direction, and the at least one electrode is directly provided on the piezoelectric layer, the coefficient of linear expansion of the piezoelectric layer in the first direction is smaller than the coefficient of linear expansion of the piezoelectric layer in the second direction, and in at least one of the piezoelectric layer, the first electrode, and the second electrode, a length along a direction parallel to the first direction is larger than a length along a direction parallel to the second direction.

3. The acoustic wave device according to claim 1, wherein a coefficient of linear expansion of at least one electrode of the first electrode and the second electrode is larger than a larger one of the coefficient of linear expansion of the piezoelectric layer in the first direction and the coefficient of linear expansion of the piezoelectric layer in the second direction, and the at least one electrode is directly provided on the piezoelectric layer, the coefficient of linear expansion of the piezoelectric layer in the first direction is larger than the coefficient of linear expansion of the piezoelectric layer in the second direction, and in at least one of the piezoelectric layer, the first electrode, and the second electrode, a length along a direction parallel to the first direction is larger than a length along a direction parallel to the second direction.

4. The acoustic wave device according to claim 1, wherein the first electrode, the second electrode, the piezoelectric layer, and the energy confining portion overlap with each other in a plan view.

5. The acoustic wave device according to claim 1, wherein the piezoelectric layer is made of lithium niobate or lithium tantalate.

6. The acoustic wave device according to claim 1, wherein the energy confining portion is a cavity provided between the support substrate and the piezoelectric layer.

7. The acoustic wave device according to claim 1, wherein the energy confining portion is an acoustic reflection film provided between the support substrate and the piezoelectric layer, the acoustic reflection film includes a high acoustic impedance layer and a low acoustic impedance layer having a lower acoustic impedance than the high acoustic impedance layer, and the high acoustic impedance layer and the low acoustic impedance layer are alternately laminated.

8. The acoustic wave device according to claim 1, further comprising:

an intermediate film provided between the piezoelectric layer and at least one of the first electrode and the second electrode.

9. A filter device, comprising:

at least one series arm resonator or at least one parallel arm resonator, each of which include an acoustic wave device, the acoustic wave device comprising:

a support substrate;

a piezoelectric layer provided on the support substrate and having a first main surface opposite a second main surface, the piezoelectric layer including a first direction orthogonal to a second direction;

a first electrode provided on the first main surface of the piezoelectric layer;

a second electrode provided on the second main surface of the piezoelectric layer and configured to face the first electrode; and an energy confining portion provided between the support substrate and the piezoelectric layer, wherein the piezoelectric layer is anisotropic with respect to a coefficient of linear expansion, and a coefficient of linear expansion of the piezoelectric layer in the first direction is different from a coefficient of linear expansion of the piezoelectric layer in the second direction, and at least one of the piezoelectric layer, the first electrode, and the second electrode is parallel to the first direction.

10. The filter device according to claim 9, comprising:

a plurality of series arm resonators according to the at least one series arm resonator connected in series; and a plurality of parallel arm resonators according to the at least one parallel arm resonator, wherein each of the plurality of parallel arm resonators is connected between a connection point between two of the series arm resonators and ground.

11. The filter device according to claim 10, wherein the plurality of series arm resonators and the plurality of parallel arm resonators share a same piezoelectric layer.

12. The filter device according to claim 10, wherein a configuration of the first electrode and a configuration of the second electrode for each of the plurality of series arm resonators are the same as a configuration of the first electrode and a configuration of the second electrode for each of the plurality of parallel arm resonators.

13. The filter device according to claim 10, wherein a configuration of the first electrode and a configuration of the second electrode for each of the plurality of series arm resonators are different from a configuration of the first electrode and a configuration of the second electrode for each of the plurality of parallel arm resonators.

14. The filter device according to claim 9, wherein the acoustic wave device further includes an intermediate film provided between the piezoelectric layer and at least one of the first electrode and the second electrode.

15. The filter device according to claim 9, wherein the energy confining portion is a cavity provided between the support substrate and the piezoelectric layer.

16. The filter device according to claim 9, wherein the piezoelectric layer is made of lithium niobate or lithium tantalate.

17. The filter device according to claim 9, wherein the first electrode, the second electrode, the piezoelectric layer, and the energy confining portion overlap with each other in a plan view.

18. The filter device according to claim 9, wherein the energy confining portion is an acoustic reflection film provided between the support substrate and the piezoelectric layer, the acoustic reflection film includes a high acoustic impedance layer and a low acoustic impedance layer having a lower acoustic impedance than the high acoustic impedance layer, and the high acoustic impedance layer and the low acoustic impedance layer are alternately laminated.

19. The filter device according to claim 9, wherein a coefficient of linear expansion of at least one electrode of the first electrode and the second electrode is larger than a larger one of the coefficient of linear expansion of the piezoelectric layer in the first direction and the coefficient of linear expansion of the piezoelectric layer in the second direction, and the at least one electrode is directly provided on the piezoelectric layer, the coefficient of linear expansion of the piezoelectric layer in the first direction is larger than the coefficient of linear expansion of the piezoelectric layer in the second direction, and in at least one of the piezoelectric layer, the first electrode, and the second electrode, a length along a direction parallel to the first direction is larger than a length along a direction parallel to the second direction.

20. The filter device according to claim 9, wherein a coefficient of linear expansion of at least one electrode of the first electrode and the second electrode is smaller than a smaller one of the coefficient of linear expansion of the piezoelectric layer in the first direction and the coefficient of linear expansion of the piezoelectric layer in the second direction, and the at least one electrode is directly provided on the piezoelectric layer, the coefficient of linear expansion of the piezoelectric layer in the first direction is smaller than the coefficient of linear expansion of the piezoelectric layer in the second direction, and in at least one of the piezoelectric layer, the first electrode, and the second electrode, a length along a direction parallel to the first direction is larger than a length along a direction parallel to the second direction.

* * * * *